United States Patent [19]
White

[11] Patent Number: 5,268,761
[45] Date of Patent: Dec. 7, 1993

[54] AUTOMATIC GAIN CONTROL SYSTEM FOR A HIGH DEFINITION TELEVISION SIGNAL RECEIVER INCLUDING AN ADAPTIVE EQUALIZER

[75] Inventor: Hugh E. White, Pennington, N.J.

[73] Assignee: RCA Thomson Licensing Corporation, Princeton, N.J.

[21] Appl. No.: 932,131

[22] Filed: Aug. 19, 1992

[51] Int. Cl.$^5$ .............................................. H04N 5/52
[52] U.S. Cl. ..................................... 358/174; 358/179
[58] Field of Search ................. 358/174, 179, 160, 12; 375/98, 14; 455/234.1, 241.1, 245.2; 360/65

[56] References Cited

U.S. PATENT DOCUMENTS

| | | | |
|---|---|---|---|
| 4,434,430 | 2/1984 | Skeckler | 358/174 |
| 4,628,362 | 11/1986 | Waehner | 358/174 |
| 4,761,687 | 8/1988 | Rumreich | 358/174 |
| 5,043,805 | 8/1991 | Citta et al. | 358/83 |
| 5,134,464 | 7/1992 | Basile | 358/12 |
| 5,175,626 | 12/1992 | White | 358/11 |

OTHER PUBLICATIONS

Liu et al., "Hardware Implementation and Cost of Decoders for HDTV", IEEE Transactions on Consumer Electronics, vol. 37, No. 3, Aug. 1991.

Eilers et al., "Spectrum Compatible High Definition Television", IEEE Transactions on Broadcasting, vol. 36, No. 1, Mar. 1990.

Primary Examiner—Victor R. Kostak
Assistant Examiner—Nathan J. Flynn
Attorney, Agent, or Firm—Joseph S. Tripoli; Eric P. Herrmann; Ronald H. Kurdyla

[57] ABSTRACT

A high definition television receiver including analog and digital signal processing circuits receives an analog high definition television signal representative of digital television information. The received signal contains narrowband high priority information and wideband low priority information. An automatic gain control (AGC) signal is developed from the narrowband information as a function of the values of coefficients of an associated adaptive equalizer, and as a function of the number of saturated samples processed by associated input analog-to-digital converters.

10 Claims, 4 Drawing Sheets

AUTOMATIC GAIN CONTROL SYSTEM FOR A HIGH DEFINITION TELEVISION SIGNAL RECEIVER INCLUDING AN ADAPTIVE EQUALIZER

FIELD OF THE INVENTION

This invention concerns apparatus in a television signal receiving system for automatically controlling the magnitude of a received television signal representative of digital image information.

BACKGROUND OF THE INVENTION

Standard television signal receiving systems typically include automatic gain control (AGC) apparatus for maintaining the magnitude of a signal applied to a detector stage substantially constant over a wide range of received signal levels. Such AGC apparatus typically generates an AGC signal as a function of the amplitude of the horizontal sync component of a detected baseband video signal component. The AGC signal is used to increase or decrease the gain of radio frequency (RF) and intermediate frequency (IF) amplifiers as an inverse function of the magnitude of the received television signal. Television signal AGC systems of this type are well known as described, for example, in U.S. Pat. No. 4,761,687—Rumreich.

Much attention has been devoted recently to the development of high definition television systems that encode and decode television information, e.g., image, audio and synchronizing information, in digital form. A transmitted digital television signal differs from a standard NTSC analog television signal in that it appears to be a random sequence of pulses, resembling a random noise signal of varying amplitude, and it may lack an RF carrier. Thus it may be difficult or impossible to use standard AGC techniques effectively for a digital television signal, due to the lack of an easily identifiable AGC reference component such as an RF carrier or a horizontal sync component similar to that of a standard NTSC television signal.

In recognition of these factors, a copending U.S. patent application Ser. No. 832,126 of T. M. Wagner et al., filed Feb. 6, 1992, describes a root-mean-square (RMS) AGC detector network suitable for use in a television receiver responsive to a signal representative of digital information. This AGC network may be advantageously used in a high definition quadrature amplitude modulated (QAM) digital television system having a spectrally shaped amplitude versus frequency response of the type shown in copending U.S. patent application Ser. No. 650,329 of Hugh Edward White. In that system, a transmitted high definition television signal lacking an RF carrier and an easily identifiable NTSC-type horizontal sync component is divided into high priority information that is intended to be received with high reliability, and lower priority standard information. The high priority information and the low priority information are conveyed as separate QAM carrier signals within different portions of the television signal frequency spectrum. The high priority information exhibits a narrower bandwidth and significantly larger amplitude than the low priority information.

SUMMARY OF THE INVENTION

Automatic gain control apparatus in accordance with the present invention is included in apparatus for receiving a television signal which may be representative of digital high definition image information, wherein an automatic gain control (AGC) signal is developed as a function of the operating condition of an adaptive equalizer. In an illustrated embodiment of the invention, the modulation spectrum of the digital television signal includes a narrowband component containing high priority information intended to be received with high reliability, and a wideband component containing low priority information. The two components are conveyed as separate QAM carrier signals within different portions of the television signal frequency spectrum. An AGC detector derives the AGC signal as a function of the values of coefficients associated with the adaptive equalizer for preventing the equalizer from exhibiting a saturated operating condition. The AGC detector also responds to the number of saturated samples processed by an input analog-to-digital converter.

DETAILED DESCRIPTION

Figure 1:
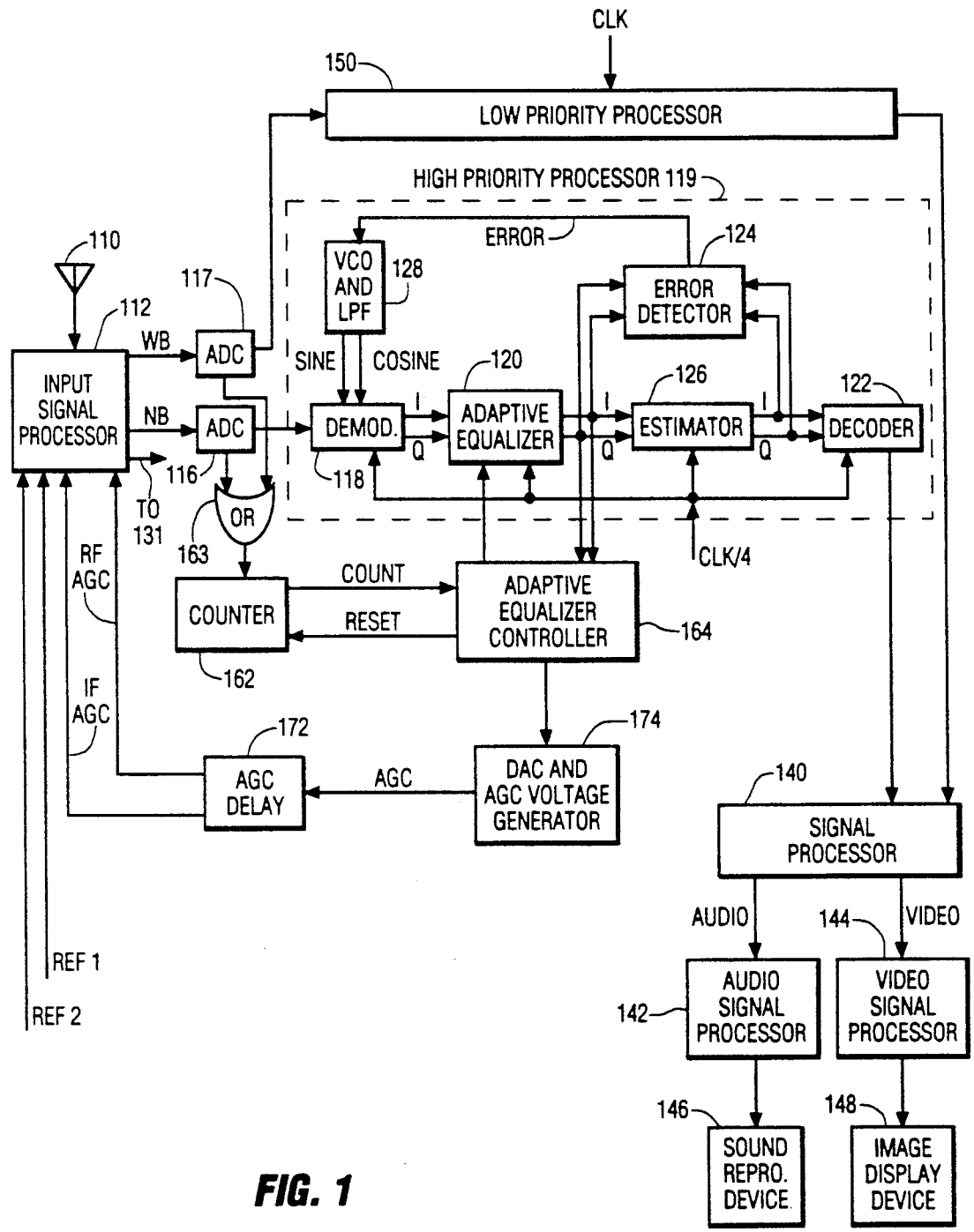
FIG. 1 is a block diagram of a portion of a high definition television receiver including digital signal processing circuits and automatic gain control apparatus according to the present invention.
Figure 2:
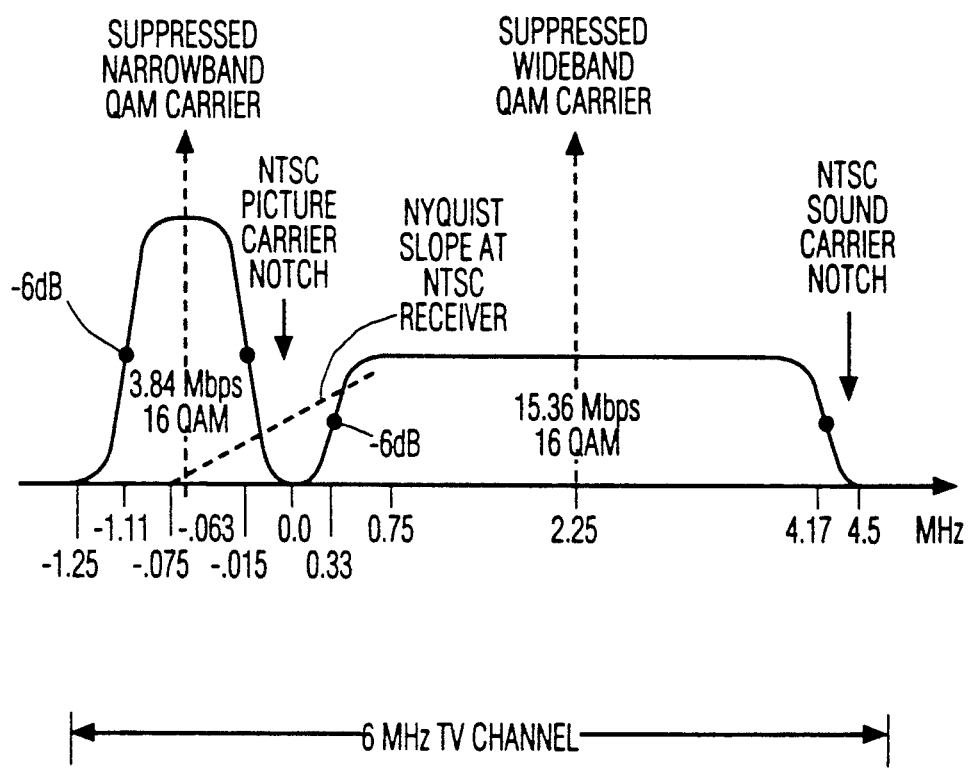
FIG. 2 depicts a baseband video frequency spectrum of a compatible simulcast multiple QAM high definition television signal received and processed by the receiver in FIG. 1.

FIG. 1 illustrates a portion of a high definition television (HDTV) receiver for receiving and digitally processing an HDTV signal of the type shown in FIG. 2. This signal will be described before proceeding with a discussion of the receiver shown in FIG. 1.

FIG. 2 illustrates the video frequency spectrum of a high definition television signal that is compatible with the 6 MHz bandwidth of a standard NTSC television signal channel, and that can be used as a simulcast signal. The frequencies along the frequency scale of FIG. 2 (−1.25 MHz to 4.5 MHz) are referenced to the 0.0 MHz frequency location of the RF picture carrier in a standard NTSC system.

The HDTV television signal is a data compressed signal divided into high and low priority information components. In this example audio, synchronizing and low frequency video information components that are intended to be received with high reliability are assigned a high priority. The synchronizing information may be in the nature of a training signal containing a unique signature or code to facilitate signal recovery and processing at a receiver, and illustratively may include field rate scanning information (e.g., start of field markers). Other less critical components, such as high frequency video information, are assigned a lower priority. The high priority information is the information needed to create a viewable image, albeit a less than perfect image, and is conveyed with significantly more power than low priority information. The high priority information exhibits a narrow bandwidth relative to the low priority information, and narrowband quadrature amplitude modulates a carrier with a 0.96 MHz symbol rate. The low priority information wideband quadrature amplitude modulates a carrier with a 3.84 MHz symbol rate. As shown by FIG. 2, this results in a 0.96 MHz bandwidth measured between frequencies of 6 db attenuation for the high priority signal, and a 3.84 MHz bandwidth for the standard priority signal. A resulting composite signal is a form of a multiple QAM signal e.g., a "twin" QAM signal in this instance. The composite twin QAM signal has been translated into the 6 MHz standard television band by means of appropriate frequency translation at the transmitter, resulting in the spectrum shown in FIG. 2.

The amplitude of the narrowband QAM component is significantly greater than that of the wideband QAM component. The −6 db bandwidth of the narrowband QAM component is 0.96 MHz, and the −6 db bandwidth of the wideband QAM component is 3.84 MHz, or four times the bandwidth of the narrowband QAM component. The nonlinear band edge transition regions of the narrowband and wideband QAM components are shaped by finite impulse response (FIR) filters with a square root of a raised cosine characteristic, to produce smooth transition regions which avoid unwanted high frequency effects produced by sharp transition regions. The narrowband component exhibits an amplitude-versus-frequency characteristic with an excess bandwidth of approximately 17%, i.e., 17% more than the theoretical minimum bandwidth of the transition region defined by the expression $\frac{1}{2} \times 1/T$ where T is the symbol period for the subject signal. The amplitude-versus-frequency response of the wideband component in the band edge transition regions (not drawn to scale) has one quarter the slope of the steeper narrowband component.

The narrowband and wideband QAM components each contain an in-phase component "I" and a quadrature-phase component "Q". The I-phase component modulates a suppressed cosine carrier, and the Q-phase component modulates a suppressed sine carrier. A data "symbol" is represented by both the I component and the Q component. In the case of a 16 QAM signal, each I and Q component exhibits four discrete amplitude levels, resulting in a total of 4×4 or 16 possible amplitude levels, or values, for each of the narrowband and wideband QAM signals, hence "16" QAM. Two bits are needed to specify the four levels of each I and Q component, whereby each data symbol requires four bits to specify the sixteen levels for an I, Q combination. Thus the bit rate of the 3.84 MHz (−6 db) wideband QAM signal is 15.36 Mbps (3.84 MHz×4 bits), and the bit rate of the 0.96 MHz (−6 db) narrowband QAM signal is 3.84 Mbps (0.96 MHz×4 bits). In a 64 QAM system, the bit rates of the narrowband and wideband components would increase by a factor of 1.5. A 32 QAM modulation scheme may be the preferred modulation mode because of inherent peak power limiting characteristics. The described multiple (twin) QAM signal exhibits significant co-channel immunity from interference associated with a standard NTSC television signal, i.e., an NTSC signal transmitted from a different location in the same channel as the twin QAM signal. Co-channel interference from the twin QAM signal into an NTSC signal also is reduced significantly.

The bit rates of the wideband and narrowband QAM signals, 15.36 Mbps and 3.84 Mbps respectively, advantageously exhibit a 4:1 integer relationship. This relationship simplifies recovering the narrowband and wideband QAM information at a receiver, since the same derived data clock can readily be used for timing the data recovery operation of both QAM components. The required data clock rates for the receiver system can be easily derived from the readily recovered high power narrowband QAM signal.

In the receiver system of FIG. 1, a broadcast twin QAM signal received by an antenna 110 is applied to input signal processor 112 including RF and IF stages as will be described in connection with FIG. 4. Processor 112 also receives reference signals REF 1 and REF 2 corresponding in frequency to reference signals used at the transmitter for developing the transmitted signal. Output signals from processor 112 include a wideband QAM component (WB) and a narrowband QAM component (NB) which are conveyed via respective analog-to-digital converters 117 and 116 to a high priority signal processor 119 and to a low priority signal processor 150. The signal processed by unit 112 exhibits the composite modulation frequency spectrum shown in FIG. 2.

A digital sampled binary output signal from unit 116 is applied to a demodulator 118 which, together with elements 120, 122, 124, 126 and 128, forms narrowband QAM high priority signal processor 119. Narrowband QAM demodulator 118 includes an input filter having an amplitude versus frequency response characteristic which substantially conforms to the shape of the amplitude versus frequency characteristic of the modulated narrowband QAM component as shown in FIG. 2. The wideband output signal from unit 117 is applied to a wideband QAM low priority signal processing network 150, which includes elements similar to those found in the narrowband QAM high priority processor. Wideband QAM low priority processor 150 includes a demodulator with an input filter having a response that substantially conforms to the shape of the amplitude versus frequency characteristic of the modulated wideband QAM component shown in FIG. 2. Thus the receiver system exhibits signal attenuating notches at frequencies associated with high energy information in a standard definition television signal.

Adaptive equalizer 120, of conventional design, receives demodulated quadrature phased I and Q components from demodulator 118. Equalizer 120 employs an adaptive digital FIR filter to compensate for amplitude and phase irregularities, e.g., including image ghosts, caused by transmission channel disturbances. In this example adaptive equalizer 120 is a so-called fractionally spaced equalizer that is capable of sampling over more than the minimum required intervals, and therefore introduces whatever phase shift and amplitude changes are needed to produce desired amplitude and phase characteristics for the output I and Q components. Equalizer 120 includes a ROM programmed with desired phase and amplitude values for the spectrum of the I and Q output components of equalizer 120. The output I and Q component values are respectively compared with the programmed values, and the input I, Q values are adjusted to approximate the programmed values based on the results of the comparison. The adjustment is accomplished by changing the values of coefficients (tap weights) of filters associated with equalizer 120. Equalizer 120 is capable of sub-sampling within a symbol period to produce the amount of phase and amplitude change needed to produce the desired output amplitude and phase characteristics. As a result of this ability, the operation of equalizer 120 is substantially insensitive to the phase of an applied clock signal, although such phase preferably should be substantially constant. Equalizer 120 may be a synchronous equalizer, although a fractionally spaced equalizer exhibits better performance with respect to the phase characteristics of an applied clock signal. Fractionally spaced and synchronous adaptive equalizers are discussed in the text "Digital Communications", Lee and Messerschmitt (Kluwer Academic Publishers, Boston, Mass., USA, 1988).

Equalized I and Q output signals from unit 120 are applied to an estimator network 126 which produces output I, Q components representing a most likely estimate of the values of I and Q components as transmitted. For example, the values of the I and Q components at the output of estimator 126 have been adjusted as needed to compensate for the distorting effect of noise acquired in the course of transmission. Estimator 126 essentially performs an interpretive function of assigning values to samples which, due to effects such as noise, do not fit exactly into assigned locations in the 16-point four quadrant signal constellation. Output signals from estimator 126 are applied to a decoder 122, which essentially exhibits the inverse of a mapping operation performed by an encoder at the transmitter. Look-up tables are employed to "unmap" the four quadrant signal constellation into the sequential four-bit (symbol) segments, in binary digit form, which existed at the transmitter before being encoded at the transmitter.

An error detector 124 monitors the I, Q input and output signals of estimator 126 for producing a carrier phase error output signal with a magnitude proportional to the phase error between the input and output I and the input and output Q signals of estimator 126. The phase error can be due to noise effects, in which case the phase error would be random in nature. The phase error also can be due to the frequency of narrowband reference signal REF 2 (generated by frequency synthesizer 135 in FIG. 3) not being substantially equal to the frequency of a corresponding reference signal used at the transmitter, in which case the phase error would not be random in nature. An output ERROR signal from error detector 124 ultimately is used to compensate for the frequency of signal REF 2 deviating from a desired value, i.e., the value of the frequency of corresponding signal REF 2 at the transmitter. Error detector 124 operates at a higher sampling rate than equalizer 120, for sensing phase and frequency offsets that may be due to a frequency deviation attributable to synthesizer 135 in FIG. 3, or to a frequency deviation of a local oscillator associated with input processor 112.

Specifically, the ERROR signal is applied to a voltage controlled oscillator (VCO) network 128, including a low pass filter, for modifying the values of quadrature phased sine and cosine reference signals applied to quadrature demodulator 118. The modified sine and cosine reference signals alter the demodulation process until the magnitude of the error representative output signal from detector 124 indicates that any deviation of the frequency of signal REF 2 from a desired value has been compensated. The low pass filter associated with unit 128 filters the ERROR signal so that the values of the reference signals from VCO 128 and thereby the operation of demodulator 118 are modified in response to errors of a non-random nature, such as the described frequency deviation, and are unaffected by random effects such as noise. Wideband QAM low priority signal processor 150 contains elements that operate in the same fashion as units 118, 120, 122, 126, 124 and 128 of the narrowband QAM processor discussed above. Additional information concerning the operation of a control loop of the type including estimator 126, detector 124, VCO 128 and demodulator 118 can be found in the text "Digital Communication" by Lee and Messerschmitt, noted previously.

A signal processor 140 combines the demodulated high priority data signal from decoder 122 and the demodulated low priority data signal from processor 150. Processor 140 may include data decompression networks such as Huffman decoders and inverse quantizers, error correcting networks, and de-multiplexing and signal combining networks for providing separate audio and video television signal components. The audio component is processed by an audio signal processor 142 before being applied to a sound reproducing device 146. The video component is processed by a unit 144 to produce an image representative signal which is applied to an image display device 148.

Figure 4:
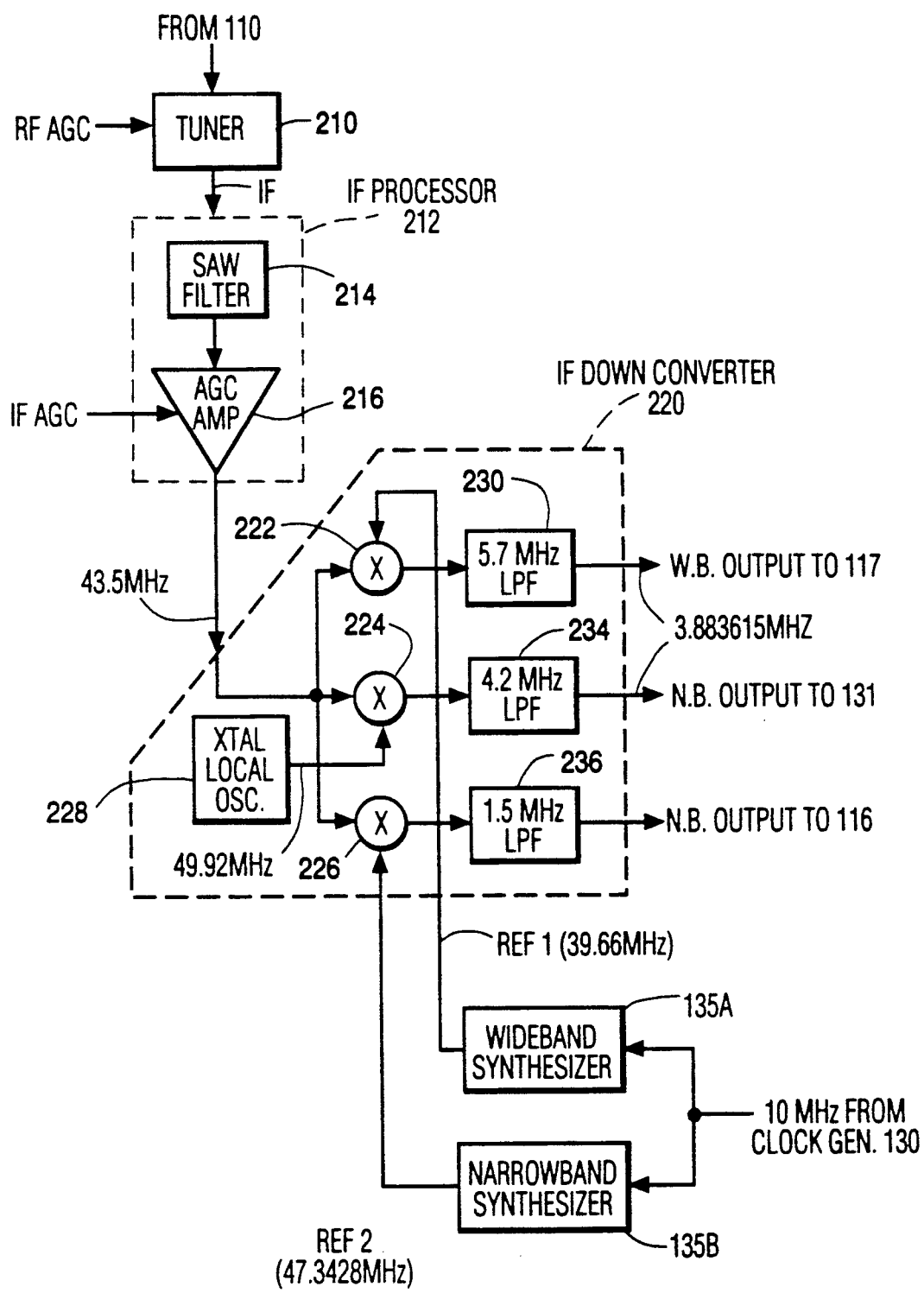

The disclosed system also includes automatic gain control (AGC) apparatus for providing RF and IF AGC signals to RF and IF circuits in input processor 112, as specifically shown in FIG. 4. AGC apparatus associated with high priority processor 119 includes a counter 162 which receives output signals from analog to digital converters 116 and 117 via a logic OR gate 163, an adaptive equalizer controller 164 operatively associated with adaptive equalizer 120, and a digital/analog converter and AGC voltage generator unit 174.

Controller 164 responds to I, Q output signals from equalizer 120 and to a COUNT signal from counter 162. Controller 164 provides the tap coefficient values for the adaptive filters in equalizer 120 to equalize the received signal. Controller 164 also provides an AGC output signal to unit 174, which converts the AGC signal from digital to analog form via an included digital/analog converter, and afterwards develops a corresponding analog AGC voltage by means of a variable voltage generator.

The AGC voltage from unit 174 is applied to an AGC delay network 172 of conventional configuration, e.g., as described in U.S. Pat. No. 4,671,687—Rumreich. AGC delay network 172 provides an output Radio Frequency (RF) AGC signal and an output Intermediate Frequency (IF) AGC signal to input processor 112 as shown in FIG. 4. As disclosed in the aforementioned Rumreich patent for example, network 172 includes means, e.g., a comparator, to determine the AGC delay point at which gain control information in the form of the RF AGC signal is conveyed to an RF amplifier in processor 112 for varying its gain.

The AGC apparatus maintains the input signals to input analog-to-digital converters 116 and 117 at a level to avoid saturation of converters 116 and 117, and to avoid saturation of the values of the coefficients of the adaptive filters associated with high priority equalizer 120, as will be discussed. Beginning with a very small input signal, an RF amplifier stage within processor 112 is kept at a high gain as long as possible for best signal-to-noise response. As the input signal level increases, the AGC action initially reduces the gain of an IF stage within processor 112 until, at a predetermined level for larger signals, the IF gain is held constant while the RF gain is reduced as a function of signal level. The AGC signals may be filtered as required to assure stable AGC control loop operation, and delayed as between RF and IF gain control in accordance with the requirements of a particular system. Controller 164 is programmed to provide periodically updated AGC information, e.g., every 10 milliseconds. The updating period, and the speed with which updated AGC information is generated, are a function of the requirements and parameters of a given system, e.g., the bandwidth of the AGC loop.

Controller 164 is a programmed digital signal processor, e.g., a microprocessor, which perform functions including calculating filter coefficient values which are conveyed to one or more adaptive FIR filters in the associated equalizer for defining the response of the equalizer. Processes by which such coefficient values may be calculated in accordance with a given algorithm are well known. For this purpose the I and Q equalizer outputs are monitored by controller 164 to determine the extent to which the outputs conform to expected amplitude values as programmed into the controller. For example, an unexpected amplitude perturbation such as a midband amplitude notch caused by a channel disturbance such as signal ghosts will be compensated for by adjusting the values of one or more filter coefficients of the equalizer. Thus the equalizer attempts to maintain a desired configuration, or shape, of the spectrum of the signal to be sent to subsequent circuits for processing.

An adaptive equalizer of conventional configuration typically is able to compensate for input signal amplitude variations to some extent, but not entirely, due to limited dynamic range which is a function of the number of bits used to quantize the input signal. Thus AGC action is usually required to augment the equalizer operation. An increase or decrease in the magnitude of the overall received signal, as manifested by the magnitude of output signals from equalizer 120, is compensated for by the AGC signals provided to input processor 112. The AGC signal is developed by monitoring the set of equalizer coefficient values to determine the largest coefficient value. This may be accomplished by means of a comparator network. A second comparator network then compares the determined largest coefficient value to a reference value equal to 90% of a maximum coefficient value, for example. The maximum coefficient value is a known programmed value above which the equalizer undesirably exhibits saturated operation. The second comparator provides an output positive or negative coefficient difference value $\Delta C$ if the determined largest coefficient value is less than or greater than the 90% reference value, respectively. If difference value $\Delta C$ is positive, an AGC signal is generated with a sense for reducing the coefficient value to the 90% value. Similarly, if the difference value is negative, an AGC signal is generated with a sense for increasing the coefficient value to the 90% value. Comparator output value $\Delta C$ may be integrated before being converted to an analog value via the digital-to-analog converter (DAC) in unit 174. The converted analog value is used to generate a corresponding gain control voltage AGC by means of the controllable voltage source in unit 174.

The AGC signal developed by controller 164 and ultimately provided to input processor 112 as RF and IF AGC signals, is automatically adjusted in value so as to maintain the largest of the coefficient values slightly below a saturated (maximum) value, e.g., at a value approximately 90% of a maximum coefficient value. If an equalizer coefficient were to exceed the maximum value, the equalizer would no longer operate linearly and would exhibit distorted operation. Nonlinear operation produces interfering intermodulation frequencies that result in errors at the output of estimator 126 and decoder 122. The AGC signals adjust the magnitude of the input signal to the equalizer, which causes the set of all equalizer coefficients to scale up or down as required. The object of the AGC process is to maintain large equalizer coefficient values so as to maximize signal resolution for the number of bits used to quantize the signal and the equalizer coefficients.

Development of the AGC signals also is a function of the output signal from counter 162, which represents the number of saturated samples processed by A/D converters 116 or 117, i.e., the number of large amplitude samples that equal or exceed the operating range of converters 116 or 117. For this purpose logic OR gate responds to the signals from converters 116 and 117 representing the number of saturated samples processed by each. The logic OR function combines the saturation representative signals from converters 116 and 117, and conveyed the OR'd signals (e.g., pulses) to counter 162. Converters 116 and 117 may be a type AD 9012 analog-to-digital converter commercially available from Analog Devices of Norwood, Mass., U.S.A., which generates an output pulse if an input sample saturates. A count of these pulses is accumulated by counter 162, and periodically read by controller 164 within a prescribed interval such as a few milliseconds, for example. The counter is reset by a RESET signal from controller 164 after an accumulated count is read by the controller.

An AGC signal developed in response to the pulse count from counter 162 reduces the gain of input signal processor 112 so as to prevent the input signal to converters 116 and 117 from becoming large enough to create a saturated (overload) condition with attendant signal distortion and loss of information. Saturation of an A/D converter produces nonlinear operation with associated intermodulation frequencies. The AGC signals also prevent the input signals from becoming so small as to result in fewer input signal bits and reduced A/D converter resolution.

A high pulse count from counter 162 suggests a very weak signal component or a loss of signal, whereby the AGC signals should reduce the gain of amplifier stages preceding A/D converters 116 and 117 to prevent saturation. AGC action compensates for a small input signal by increasing the signal gain of the RF and IF stages, but this may lead to very high gain and saturation of input A/D converter 116 with amplified noise as indicated by the pulse count from counter 162. Saturation is particularly likely to occur due to the combination of high RF and IF amplification of in-band noise alone. This saturated mode is somewhat unpredictable, and hinders the effectiveness of an A/D converter when a good signal appears, due to a time lag associated with an A/D converter coming out of saturation. In this embodiment controller 164 is programmed to ignore information concerning the status of the equalizer coefficients when either or both of A/D converters 116 and 117 saturate as indicated by the output of counter 162, at which time controller 164 produces an AGC signal which reduces the gain of input processor 112 until both A/D converters are out of saturation. Ignoring information concerning the status of the equalizer coefficients for AGC purposes at this time is acceptable because saturated A/D converters and saturated equalizer coefficients are unlikely to occur at the same time, as noted below.

Controller 164 may respond to the pulse count from counter 162 in various ways for producing an AGC value for reducing signal gain to reduce A/D converter saturation. For example, controller 164 may respond to a given pulse count by selecting a programmed ROM value for reducing signal gain. The ROM value would be converted to an analog value and converted to a suitable voltage by means of unit 174. Monitoring the set of equalizer coefficients for developing AGC signals, as previously discussed, is useful primarily under normal conditions when an input signal is being received. For this condition, in a receiver with a typical RF/IF gain control characteristic, saturation of the input A/D converters such as units 116 and 117 is not likely to result. A saturated A/D converter condition is most likely to occur under high RF/IF gain conditions when the received signal is lost.

The objective of maintaining desired (non-saturated) equalizer coefficient values is generally considered to be more important than the objective of preventing the A/D converters from saturating. However, the latter objective represents a valuable option from a practical standpoint, and may represent a primary objective in some systems. The disclosed arrangement of OR gate 163 and counter 162 is believed to be a simple and effective way of preventing unwanted saturation of the input A/D converters. However, other more complicated arrangements employing more sophisticated logic control and switching networks could be employed to provide additional control. For example, the saturation representative pulse outputs of converters 116 and 117 could be sensed individually for the purpose of providing individual control voltages.

A direct digital frequency synthesizer 129 produces a 15.36 MHz clock signal CLK in response to a master clock signal from a system clock generator 130, which also provides the master clock signal to a frequency synthesizer 135 for developing reference signals REF 1 and REF 2. The master clock signal from generator 130 is used to synchronize the operation of synthesizers 129 and 135, and exhibits a frequency of 10 MHz in this example. The frequencies of signals REF 1 and REF 2 nominally correspond to those of corresponding signals used at the transmitter. Any deviation of the frequencies of these signals from desired frequencies is compensated for as described previously. Signal CLK from source 129 is the clock signal for digital signal processing circuits in low priority processor 150 in FIG. 1. High priority narrowband processor 119 of FIG. 1 processes a signal with a bandwidth that is one-fourth that of the wideband signal. Hence, the high priority processor elements respond to a clock signal CLK/4 with a frequency (3.84 MHz) one-fourth that of signal CLK, as provided by a frequency divider 136.

The frequency of clock signal CLK at the receiver corresponds to the frequency of a clock signal employed at the transmitter. Establishing the proper receiver clock frequency is facilitated by developing the receiver clock signal from information contained in the more reliably received high power narrowband QAM component as will be seen in FIG. 4. For this purpose a further narrowband output signal from input processor 112, as will be seen in FIG. 4, is applied to a nonlinear signal generator 131, e.g., a power of N generator such as a multiplier that multiplies the input by itself, where N may be 2 or 4. Unit 131 produces a single frequency component at the symbol rate of the narrowband QAM component. In this case the symbol rate is 0.96 MHz, one-quarter of the bit rate. Unit 131 also produces a highly attenuated output component at the symbol rate of the low power wideband QAM component, which output component is ignored by subsequent signal processing units.

The 0.96 MHz symbol rate output component from unit 131 is bandpass filtered by a filter 132 before being applied to a phase control unit 137 including a phase detector. Filter 132 has a center frequency at the 0.96 MHz symbol frequency. The bandwidth of filter 132 is not critical, but should be sufficient to provide an adequate signal-to-noise ratio. Phase control unit 137, responsive to the 0.96 MHz symbol rate output component from filter 132, forms a phase locked loop together with a low pass filter 138, synthesizer 129 and a divide-by-16 frequency divider 139. Filter 138 removes spurious frequencies including noise produced by the operation of nonlinear signal generator 131. produced by the operation of nonlinear signal generator 131. Frequency divider 139 receives a 15.36 MHz signal from synthesizer 129 and provides a frequency divided 0.96 MHz output signal to a control input of phase detector 137. Synthesizer 129 includes a register which accumulates phase increments determined by the signal applied to a control input of unit 129 from filter 138, at a rate determined by the frequency of the signal from clock generator 130. The accumulated phase value addresses a ROM containing sinusoidal values which synthesize the output signal from unit 129. The function of unit 129 may be implmeented with integrated circuit type Q2334 commercially available from Qualcomm Corporation of San Diego, Calif.

In this system the high priority component advantageously exhibits a narrow bandwidth with small (17%) excess bandwidth and sharp out-of-band attenuation, i.e., steep "skirts". The magnitude of the output signal from a nonlinear signal generator (e.g., multiplier) such as unit 131 in response to an input QAM signal is a function of the shape of the amplitude versus frequency characteristic of the input signal, particularly at the band edges. For a given passband amplitude characteristic, a steep slope at the band edge produces a small amplitude single frequency output component at the symbol rate of the input signal, whereas a shallow band edge slope produces a large amplitude output component.

The phase locked loop including elements 137, 138, 129 and 139 coact to maintain a substantially 0° phase difference between the 0.96 MHz input signal applied to phase control 137 from units 131 and 132, and the 0.96 MHz input signal applied to phase control 137 from frequency divider 139. The latter signal is developed by synthesizer 129 in response to a phase error representative control signal from filter 138.

Figure 3:
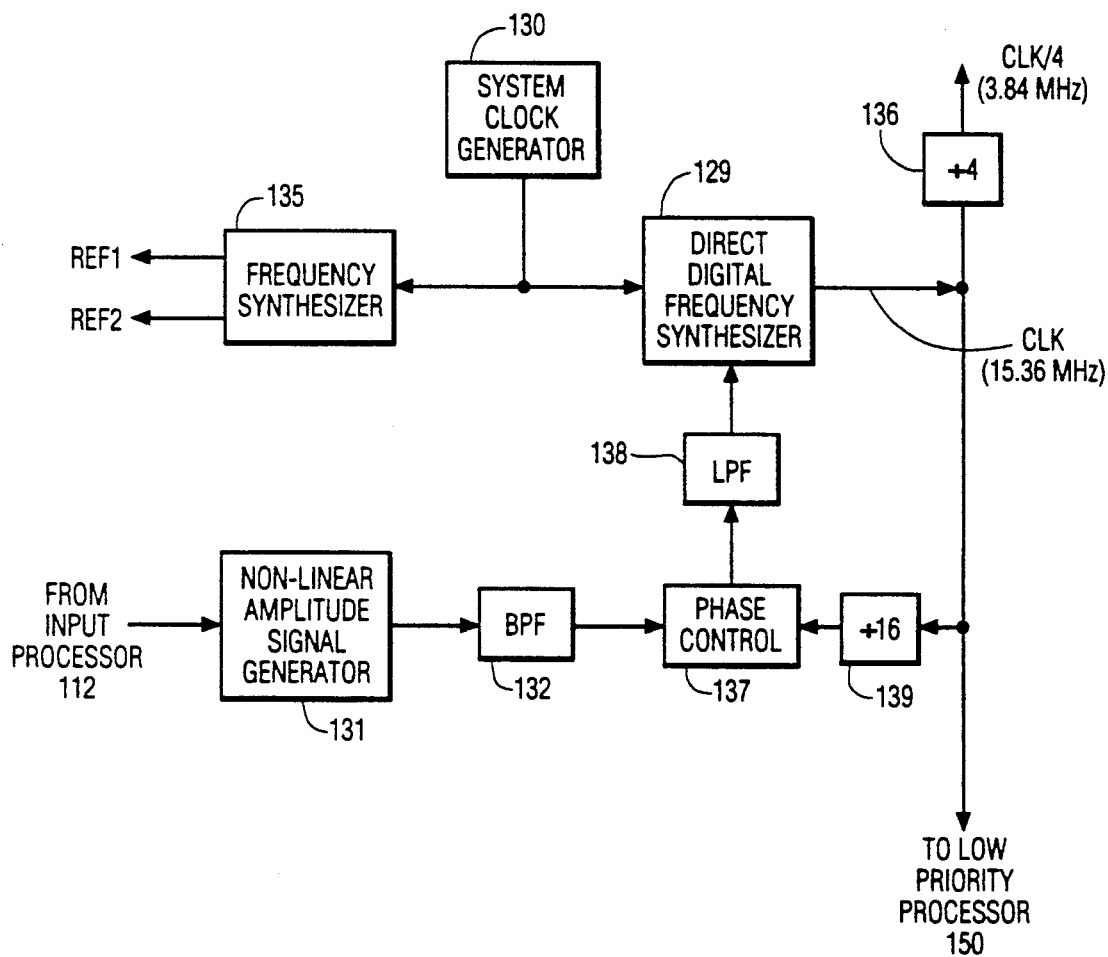
FIGS. 3-4 show details or protions of the system of FIG. 1.

FIG. 4 shows details of input signal processor 112 of FIG. 1 and frequency synthesizer 135 of FIG. 3. Input signals from antenna 110 are applied to a tuner section 210 which also includes a mixer for producing an intermediate frequency (IF) output signal in accordance with known signal processing techniques. An RF amplifier within tuner 210 is gain controlled in response to an RF AGC signal from AGC network 160 in FIG. 1. The IF output signal from tuner 210 is applied to an IF processor 212 including a SAW filter 214 having a bandwidth of approximately 6 MHz centered at 43.5 MHz, and an AGC amplifier 216 which is gain controlled in response to an IF AGC signal from AGC network 160.

An output signal from processor 212 is applied to an IF frequency down converter 220. Converter 220 includes signal multipliers (mixers) 222, 224 and 226, output low pass filters 230, 234 and 236, and a crystal controlled 49.92 MHz local oscillator 228, all arranged as shown. Multiplier 224 responds to a reference signal from oscillator 228 and to the output signal from processor 212. Multipliers 222 and 226 also respond to the output signal from processor 212, and to reference signal REF 1 and REF 2. The latter signals are developed by wideband synthesizer component 135A and narrowband synthesizer component 135B of unit 135 in FIG. 3, in response to the 10 MHz system clock signal. An output signal from filter 234 is applied to unit 131 in FIG. 3. Frequency down converted wideband and narrowband output signals from filters 230 and 236 are provided at outputs of filters 230 and 236, respectively.

What is claimed is:

1. In a system for receiving a television signal, apparatus comprising:

input signal processing means having an input for receiving a signal representative of digital signal information, and an output providing an output signal having a magnitude;

digital signal processing means responsive to said output signal provided from said input signal processing means, said digital signal processing means including an adaptive equalizer;

video signal processing means for providing an image representative signal in response to an output signal from said digital signal processing means; and automatic gain control (AGC) means with an input coupled to said digital signal processing means and an output coupled to said input signal processing means for developing at said last-named output a control signal for automatically controlling said magnitude of signals provided to said digital signal processing means from said input signal processing means; wherein said AGC means is responsive to a signal representing an operating condition of said adaptive equalizer.

2. Apparatus according to claim 1, wherein
   said AGC means develops said control signal as a function of coefficient values associated with said adaptive equalizer.

3. Apparatus according to claim 1, wherein
   said digital signal processing means includes an input analog-to-digital converter; and
   said AGC means responds to a signal representative of an operating condition of said analog-to-digital converter.

4. Apparatus according to claim 3, wherein
   said AGC means responds to a signal representative of saturated samples processed by said analog-to-digital converter.

5. Apparatus according to claim 1, wherein
   said AGC means develops RF and IF AGC signals for application to RF and IF stages of said input signal processing means, respectively.

6. Apparatus according to claim 1, wherein
   said signal received by said input signal processing means represents high definition digital television image information, exhibits a bandwidth compatible with a pre-existing standard definition television channel, and comprises a narrowband component containing high priority information and a wideband component containing relatively lower priority information; and
   said AGC means derives said control signal from said narrowband component.

7. Apparatus according to claim 6, wherein
   said narrowband component is a quadrature amplitude modulation (QAM) signal.

8. Apparatus according to claim 6 wherein
   said AGC means develops said control signal as a function of coefficient values associated with said adaptive equalizer.

9. Apparatus according to claim 6 and further including
   a first input analog to digital converter responsive to said narrowband component;
   a second input analog to digital converter responsive to said wideband component; and wherein
   said AGC means responds to a signal representative of an operating condition of said first and second converters.

10. Apparatus according to claim 9 wherein
    said AGC means responds to a signal representative of saturated samples processed by said first and second converters.

* * * * *